(12) United States Patent
Jang et al.

(10) Patent No.: US 8,963,119 B2
(45) Date of Patent: Feb. 24, 2015

(54) SEMICONDUCTOR NANOCRYSTAL, METHOD OF MANUFACTURE THEREOF AND ARTICLES INCLUDING THE SAME

(75) Inventors: Eun-Joo Jang, Suwon-si (KR); Shin-Ae Jun, Seongnam-si (KR); Sang-Wook Kim, Suwon-si (KR); Sung-Woo Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 397 days.

(21) Appl. No.: 13/041,157

(22) Filed: Mar. 4, 2011

(65) Prior Publication Data

US 2011/0315954 A1    Dec. 29, 2011

(30) Foreign Application Priority Data

Jun. 24, 2010 (KR) ........................ 10-2010-0060233

(51) Int. Cl.
*H01L 33/24* (2010.01)
*H01L 21/02* (2006.01)
*B82Y 30/00* (2011.01)
*B82Y 40/00* (2011.01)
*C01G 9/00* (2006.01)
(Continued)

(52) U.S. Cl.
CPC .......... *H01L 21/02601* (2013.01); *B82Y 30/00* (2013.01); *B82Y 40/00* (2013.01); *C01G 9/006* (2013.01); *C09K 11/02* (2013.01); *H01L 21/024* (2013.01); *H01L 21/02409* (2013.01); *H01L 21/02455* (2013.01); *H01L 21/02461* (2013.01); *H01L 21/02538* (2013.01); *H01L 21/02551* (2013.01); *H01L 21/02557* (2013.01); *H01L 21/02628* (2013.01); *C09K 11/565* (2013.01); *C09K 11/70* (2013.01); *C09K 11/883* (2013.01); *H01L 51/502* (2013.01); *H05B 33/14* (2013.01); *H01L 27/322* (2013.01); *H01L 33/502* (2013.01)
USPC ........................................................ 257/13

(58) Field of Classification Search
USPC ........................................................... 257/13
See application file for complete search history.

(56) References Cited

U.S. PATENT DOCUMENTS 7,588,828 B2    9/2009  Mushtaq et al.
8,022,432 B2 *  9/2011  Yi et al. ......................... 257/99
(Continued)

FOREIGN PATENT DOCUMENTS

JP        2009-161372 A     7/2009
KR     1020050074779 A     7/2005
(Continued)

OTHER PUBLICATIONS

Battaglia, D. et al., Coupled and Decoupled Dual Quantum Systems in One Semiconductor Nanocrystal, J Am Chem Soc., 2005;127(31): 10889-10897.
(Continued)

*Primary Examiner* — Ori Nadav
(74) *Attorney, Agent, or Firm* — Cantor Colburn LLP

(57) ABSTRACT

A semiconductor nanocrystal including a core including ZnSe, ZnTe, ZnS, ZnO, or a combination comprising at least one of the foregoing, wherein the core has a diameter of about 2 nanometers to about 5 nanometers and an emitted light wavelength of about 405 nanometers to about 530 nanometers; and a first layer disposed on the core, the first layer including a Group III-V semiconductor, wherein the semiconductor nanocrystal has a full width at half maximum of an emitted light wavelength of less than or equal to about 60 nanometers.

22 Claims, 14 Drawing Sheets

(51) Int. Cl.
*C09K 11/02* (2006.01)
*C09K 11/56* (2006.01)
*C09K 11/70* (2006.01)
*C09K 11/88* (2006.01)
*H01L 51/50* (2006.01)
*H05B 33/14* (2006.01)
*H01L 27/32* (2006.01)
*H01L 33/50* (2010.01)

(56) References Cited

U.S. PATENT DOCUMENTS

| | | | |
|---|---|---|---|
| 2005/0129947 A1* | 6/2005 | Peng et al. | 428/403 |
| 2007/0138460 A1* | 6/2007 | Choi et al. | 257/13 |
| 2008/0012031 A1* | 1/2008 | Jang et al. | 257/89 |
| 2008/0220593 A1 | 9/2008 | Pickett et al. | |
| 2008/0252209 A1* | 10/2008 | Jang et al. | 313/506 |
| 2008/0297044 A1* | 12/2008 | Jun et al. | 313/504 |
| 2009/0230382 A1 | 9/2009 | Banin et al. | |
| 2010/0062154 A1 | 3/2010 | Shin et al. | |
| 2010/0103795 A1* | 4/2010 | Buntel et al. | 369/100 |

FOREIGN PATENT DOCUMENTS

| | | |
|---|---|---|
| KR | 1020060087313 A | 8/2006 |
| KR | 100768648 B1 | 10/2007 |
| KR | 1020080044278 A | 5/2008 |
| KR | 1020080046158 A | 5/2008 |
| KR | 1020090065073 A | 6/2009 |

OTHER PUBLICATIONS

Geng, J. et al., Facile Route to Zn-Based II-VI Semiconductor Spheres, Hollow Spheres, and Core/Shell Nanocrystals and Their Optical Properties, Langmuir, 2007, 23 (20):10286-10293.

Kim, S.-W. et al., Engineering InAs$_x$P$_{1-x}$/InP/ZnSe III-V Alloyed Core/Shell Quantum Dots for the Near-Infrared, J. Am. Chem. Soc., 2005, 127 (30): 10526-10532.

Kim, S. et al., Bandgap engineered reverse type-I CdTe/InP/ZnS core-shell nanocrystals for the near-infrared, Chem Commun (Camb)., 2009;(10): 1267-1269. Epub Jan. 19, 2009.

Kim, S. et al., Reverse Type-I ZnSe/InP/ZnS Core/Shell/Shell Nanocrystals: Cadmium-Free Quantum Dots for Visible Luminescence, Small, 2001, 7 (1): 70-73.

Li, C. et al., Synthesis of Cd-free water-soluble ZnSe$_{1-x}$Te$_x$ nanocrystals with high luminescence in the blue region, J. of Colloid and Interface Science, 2008, 321 (2): 468-476.

Li, L. et al., Highly Luminescent CuInS$_2$/ZnS Core/Shell Nanocrystals: Cadmium-Free Quantum Dots for In Vivo Imaging, Chem. Mater., 2009, 21 (12): 2422-2429.

Narayanaswamy, A. et al., The Effect of Temperature and Dot Size on the Spectral Properties of Colloidal InP/ZnS Core-Shell Quantum Dots, ACS Nano. 2009, 3(9): 2539-2546.

Verma, P. et al., Synthesis and characterisation: Zinc oxide-sulfide nanocomposites, Physica B: Condensed Matter, 2009, 404 (21): 3894-3897.

Xie, R. et al., Colloidal InP Nanocrystals as Efficient Emitters Covering Blue to Near-Infrared, J. Am. Chem. Soc., 2007, 129 (50): 15432-15433.

Xie, R. et al., Synthesis of Cu-Doped InP Nanocrystals (d-dots) with ZnSe Diffusion Barrier as Efficient and Color-Tunable NIR Emitters, J. Am. Chem. Soc., 2009, 131 (30): 10645-10651.

Manciu, F.S. et al., Infrared and Raman spectroscopies of InP/II-VI core-shell nanoparticles, Physica E: Low-dimensional Systems and Nanostructures, 2005; 26 (1-4): 14-18.

Shen, H. et al., Phosphine-free synthesis of high quality ZnSe, ZnSe/ZnS, and Cu-, Mn-doped ZnSe nanocrystals, Dalton Trans. 2009; 21(47):10534-10540.

* cited by examiner

SEMICONDUCTOR NANOCRYSTAL, METHOD OF MANUFACTURE THEREOF AND ARTICLES INCLUDING THE SAME

CROSS-REFERENCE TO RELATED APPLICATION

This application claims priority to Korean Patent Application No. 10-2010-0060233, filed on Jun. 24, 2010, and all the benefits accruing therefrom under 35 U.S.C. §119, the content of which in its entirety is herein incorporated by reference.

BACKGROUND

1. Field

This disclosure relates to a semiconductor nanocrystal having high luminous efficiency and a narrow full width at half maximum, methods of manufacture thereof, and articles including the same.

2. Description of the Related Art

A semiconductor nanocrystal, which is also called a quantum dot, is a semiconductor material with a nanometer scale crystalline structure and which includes hundreds to thousands of atoms.

Because a semiconductor nanocrystal is very small, it has a large surface area per unit volume and exhibits a quantum confinement effect. Because of the large surface area and quantum confinement effect, the semiconductor nanocrystal has unique physiochemical characteristics which differ from the intrinsic characteristics of a corresponding bulk semiconductor material.

Particularly, because a semiconductor nanocrystal has a size and composition which are selected to provide a selected band gap energy and because the semiconductor nanocrystal has good luminescent characteristics, such as high color purity, researchers are studying methods to use the semiconductor nanocrystal in a display device, a bioluminescent light-emitting device, or the like.

A commercially available semiconductor nanocrystal including Cd has been reported to have excellent characteristics. However, because Cd has environmental issues, there remains a need for a nanometer scale light-emitting material which does not include Cd, is environmentally friendly, and is safe for a human body.

However, it is difficult to select a material which emits visible light because the wavelength of the emitted light depends on the intrinsic band gap of the material itself. As for a Group III-V semiconductor, there has been much research on a nanocrystal based on InP, because InP provides desirable nanocrystal synthesis conditions and a desirable band gap. InP emits infrared light and has a band gap of about 1.4 eV, which is relatively narrow. When an InP nanocrystal is prepared which has a nanometer scale particle size and a larger band gap, the InP nanocrystal emits a blue light, but its stability may deteriorate due to the very small size of the nanocrystals. However, because InAs, which may be easily synthesized using a wet method, has a very narrow band gap of about 0.9 electron volts (eV), InAs nanocrystals may not be readily synthesized to provide a nanocrystal emitting visible light. In addition, because a Group III-V precursor has relatively less reactivity than a Group II-VI precursor, the Group III-V precursor may grow into a nanocrystal at a slower speed, and thus, the Group III-V precursor may provide a nanocrystalline material having a less uniform size distribution than the Group II-VI precursor.

SUMMARY

An aspect of this disclosure provides a semiconductor nanocrystal having a similar band gap energy but improved stability by maintaining a relatively large nanocrystal size.

Another aspect of this disclosure provides a semiconductor nanocrystal with a uniform size distribution by improving its reactivity.

A further aspect of this disclosure provides a semiconductor nanocrystal with high luminous efficiency.

A further aspect of this disclosure provides a semiconductor nanocrystal with improved color purity.

A further aspect of this disclosure provides an environmentally-friendly semiconductor nanocrystal.

A further aspect of this disclosure provides a composition including the semiconductor nanocrystal.

A further aspect of this disclosure provides a semiconductor nanocrystal composite.

A further aspect of this disclosure provides a light-emitting device including the semiconductor nanocrystal.

According to an aspect of this disclosure, a semiconductor nanocrystal includes ZnSe, ZnTe, ZnS, ZnO, or a combination comprising at least one of the foregoing, wherein the core has a diameter of about 2 nanometers to about 5 nanometers and a light emitting wavelength of about 405 nanometers to about 530 nm; and a first layer disposed on the core, the first layer including a Group III-V semiconductor, wherein the semiconductor nanocrystal has a full width at half maximum of an emitted light wavelength of less than or equal to about 60 nanometers.

While not wanting to be bound by theory, it is believed that a more uniform size and shape of a nanocrystal provides a narrower full width at half maximum of an emitted light wavelength. Accordingly, the nanocrystal may have a full width at half maximum of about 50 nanometers (nm) or less, and about 35 nm or less in another embodiment. When the nanocrystal has a full width at half maximum of about 35 nm or less, it may be applied to a display and provide an excellent color gamut. Also, when a diameter of the nanocrystal is sufficiently uniform such that a uniformity of the nanocrystal is very high, a full width at half maximum of more than about 10 nm may be maintained.

Accordingly, the core may have a full width at half maximum of about 10 nanometers to about 30 nanometers. When a nanocrystal has a sufficiently uniform size and shape, a core may have the aforementioned full width at half maximum. A core desirably maintains a full width at half maximum of about 10 nanometers to about 30 nanometers, a nanocrystal may have a multi-shell thereon, and may have a narrow full width at half maximum of about 60 nanometers or less. The core may have a luminous efficiency of 20% or more. The core may only emit light having an energy corresponding to a band edge. The core may only have band edge emission. In addition, the core may not have substantial trap emission. In an embodiment, the trap emission is suppressed. The core may have various luminous efficiencies depending on its application. When the core does not have a defect on a surface thereof, it may have about 30% or more increased luminous efficiency, and in another embodiment about 40% or more increased luminous efficiency.

The first layer may have a thickness of about 0.3 nanometers to about 2 nanometers.

A material of the core may have a larger band gap energy than a material of the first layer. The first layer may include AlN, AlP, AlAs, AlSb, GaN, Gap, GaAs, GaSb, InN, InP, InAs, InSb, or a combination comprising at least one of the foregoing.

The core may emit light having a wavelength of about 410 to about 1200 nm.

The semiconductor nanocrystal may further include a second layer disposed on the first layer and including a Group II-VI or a Group III-V semiconductor. A material of the second layer may have a larger band gap energy than a material of the first layer. The second layer may include ZnTe, ZnSe, ZnS, ZnO, AlN, AlP, AlAs, AlSb, GaN, Gap, GaAs, GaSb, InN, InP, InAs, InSb, or a combination comprising at least one of the foregoing.

According to another aspect of this disclosure, a composition for preparing a semiconductor nanocrystal core is provided that includes a Se precursor, a Te precursor, a S precursor, an O precursor, or a combination comprising at least one of the foregoing, a Zn precursor, and a surfactant. The core may have a diameter of about 2 to about 5 nm and a light-emitting wavelength of about 405 to about 530 nm.

In addition, the composition for a core may further include a Group III precursor and a Group V precursor. Furthermore, the composition may include a Group II precursor and a VI precursor.

According to another aspect of this disclosure, a semiconductor nanocrystal composite is provided that includes the semiconductor nanocrystal; and a matrix. The semiconductor nanocrystal may provide improved luminous efficiency after being mixed with water.

The matrix may include a transparent polymer material such as epoxy, acrylate, polyethylene, silicon, or the like, an inorganic material such as silica, alumina, titania, zirconia, or the like, or a combination comprising at least one of the foregoing.

According to a further aspect of this disclosure, a light-emitting device includes the semiconductor nanocrystal as a light-emitting material. The light-emitting device may be a current-driven or light-transforming type.

Also disclosed is a method of preparing a semiconductor nanocrystal including: contacting a Group II precursor, a Group VI precursor, and a solvent to prepare a first solution; thermally decomposing the first solution to prepare a core; contacting the core with a Group III precursor and a Group V precursor to prepare a second solution; heat treating the second solution to form a first layer on the core; and contacting the second solution with a Group II and a Group VI precursor, or a Group III precursor and Group V precursor to prepare the semiconductor nanocrystal.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
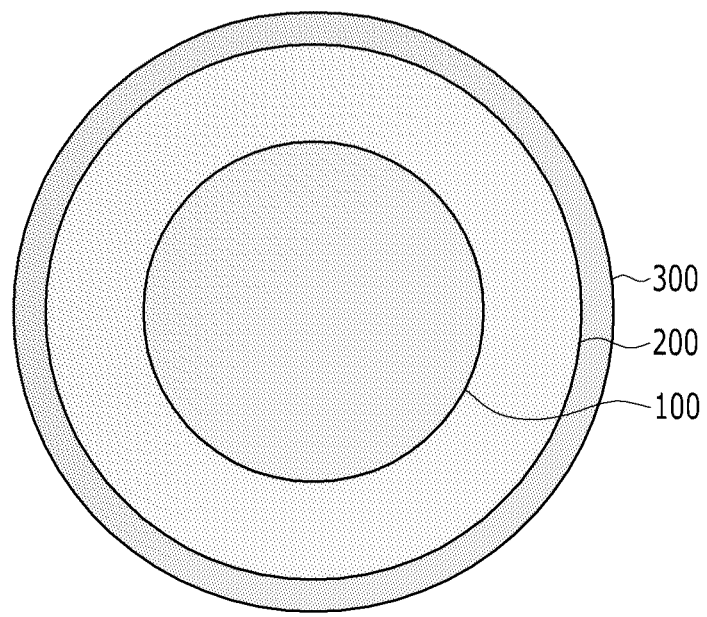
FIG. 1 is the schematic cross-sectional view of an embodiment of a semiconductor nanocrystal.

This disclosure will be described more fully hereinafter with reference to the accompanying drawings, in which exemplary embodiments are shown. This disclosure may, however, be embodied in many different forms and is not to be construed as limited to the exemplary embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" refers to a straight or branched chain saturated aliphatic hydrocarbon having the specified number of carbon atoms, specifically 1 to 24 carbon atoms, more specifically 1 to 6 carbon atoms. Alkyl groups include, for example, groups having from 1 to 50 carbon atoms (C1 to C50 alkyl).

The term "cycloalkyl" refers to a group that comprises one or more saturated and/or partially saturated rings in which all ring members are carbon, such as cyclopropyl, cyclobutyl, cyclopentyl, cyclohexyl, cycloheptyl, cyclooctyl, adamantyl and partially saturated variants of the foregoing, such as cycloalkenyl groups (e.g., cyclohexenyl), or cycloalkynyl groups. Cycloalkyl groups do not comprise an aromatic ring or a heterocyclic ring. When the number of carbon atoms is specified (e.g., C3 to C15 cycloalkyl), the number refers to the number of ring members present in the one or more rings.

As used herein "aryl," means a cyclic moiety in which all ring members are carbon and at least one ring is aromatic. More than one ring may be present, and any additional rings may be independently aromatic, saturated or partially unsaturated, and may be fused, pendant, spirocyclic or a combination comprising at least one of the foregoing.

An "alkylamine group" is a group of the formula -Q-N(Rw)(Rz), wherein Q is a C1 to C24 alkylene group, and Rw and Rz are each independently hydrogen, a C1 to C14 alkyl, a C1 to C14 alkenyl, a C1 to C14 alkynyl, a C3 to C14 cycloalkyl, or a C6 to C14 aryl; such that the total number of carbon atoms in Q, Rw, and Rz is from 1 to 24.

As used herein, a "primary amine" means an amine having the formula $RNH_2$, wherein R is an alkyl group, or an aryl group.

As used herein, a "secondary amine" means an amine having the formula RR'NH, wherein R and R' are each independently an alkyl group, an aryl group, or the like.

As used herein, a "tertiary amine" means an amine having the formula RR'R"N, wherein R, R', and R" are each independently an alkyl group, an aryl group, or the like.

As used herein, a "primary alcohol" means an alcohol having the formula $RCH_2OH$, wherein R is an alkyl group, or an aryl group.

As used herein, a "secondary alcohol" means an alcohol having the formula RR'COH, wherein R and R' are each independently an alkyl group, an aryl group, or the like.

As used herein, a "tertiary alcohol" means an alcohol having the formula RR'R"COH, wherein R, R', and R" are each independently an alkyl group, an aryl group, or the like.

The term "alkylene" refers to a straight, branched or cyclic divalent aliphatic hydrocarbon group, and may have from 1 to about 24 carbon atoms, more specifically 2 to about 12 carbons. Exemplary alkylene groups include methylene (—$CH_2$—), ethylene (—$CH_2CH_2$—), propylene (—$(CH_2)_3$—), cyclohexylene (—$C_6H_{10}$—), methylenedioxy (—O—$CH_2$—O—), or ethylenedioxy (—O—$(CH_2)_2$—O—).

"Cycloalkylene" refers to a divalent radical formed by the removal of two hydrogen atoms from one or more rings of a cycloalkyl group (a nonaromatic hydrocarbon that comprises at least one ring).

"Alkenyl" is a straight or branched chain hydrocarbon that comprises at least one carbon-carbon double bond.

The term "alkynyl" refers to a straight or branched chain hydrocarbon that has one or more unsaturated carbon-carbon bonds, at least one of which is a triple bond.

"Alkenylene" refers to a straight or branched chain divalent aliphatic hydrocarbon group that comprises at least one carbon-carbon double bond.

The term "alkynylene" refers to a straight or branched chain divalent aliphatic hydrocarbon that has one or more unsaturated carbon-carbon bonds, at least one of which is a triple bond.

Throughout the present disclosure, reference is made to various heterocyclic groups. Within such groups, the term "hetero" refers to a group that comprises at least one ring member that is a heteroatom (e.g., 1 to 4 heteroatoms, each independently N, O, S, P, or Si). In each instance, the total number of ring members may be indicated (e.g., a 3- to 10-membered heterocycloalkyl). If multiple rings are present, each ring is independently aromatic, saturated or partially unsaturated and multiple rings, if present, may be fused, pendant, spirocyclic or a combination comprising at least one of the foregoing. Heterocycloalkyl groups comprise at least one non-aromatic ring that contains a heteroatom ring member.

Hereinafter, a semiconductor nanocrystal will be disclosed in further detail.

The semiconductor nanocrystal includes a core including a Group II-VI semiconductor and a first layer disposed on (e.g., surrounding) the core, the first layer including a Group III-V semiconductor, wherein "Group" refers to a Group of the periodic table of the elements. The semiconductor nanocrystal has a full width at half maximum ("FWHM") of an emitted light wavelength of less than or equal to about 60 nanometers (nm), specifically about 1 nm to about 60 nm, more specifically about 3 nm to about 50 nm, more specifically still about 5 nm to about 35 nm. The emitted light wavelength is in a visible or infrared region of the electromagnetic spectrum. For example, the visible light and infrared regions may be about 410 to about 1200 nm, specifically about 420 to about 1100 nm, more specifically about 430 to about 1000 nm. While not wanting to be bound by theory, it is understood that a uniformity of the particles of a nanocrystalline material is proportional to a full width at half maximum of an emitted light wavelength. Thus a nanocrystalline material having a more uniform particle size and particle shape has a narrower full width at half maximum. Accordingly, the nanocrystal may have a full width at half maximum of less than or equal to about 50 nm, and in another embodiment may have a full width at half maximum of less than or equal to about 35 nm, specifically less than or equal to about 30 nm, more specifically less than or equal to about 25 nm. When the nanocrystal has a full width at half maximum of less than about 35 nm, it may be used to provide a display, and may provide an excellent color gamut. In addition, when the semiconductor nanocrystal has a sufficient diameter consistency such that a nanocrystal uniformity is very high, a full width at half maximum of more than or equal to about 10 nm may be provided.

The core may have a diameter of about 2 to about 10 nm, specifically about 2 to about 5 nm, more specifically about 2 to about 3.5 nm, and a full width at half maximum of about 10 to about 30 nm. When the nanocrystal has a core with the aforementioned full width at half maximum, the nanocrystal has a sufficiently uniform size and shape. When the core may have a full width at half maximum of about 10 to about 30 nm, a nanocrystal having a multi-shell grown on the core may maintain a full width at half maximum of less than or equal to about 60 nm, specifically about 1 nm to about 60 nm, more specifically about 3 nm to about 50 nm, more specifically still about 5 nm to about 35 nm.

In particular, the core may include Zn—Se, Zn—Te, ZnS, ZnO, or a combination comprising at least one of the foregoing. When the core has a diameter of about 2 to about 5 nm, and an emitted light wavelength of about 405 to about 530 nm, it may improve color purity and the like of semiconductor nanocrystal. When a core has a diameter of about 2 to about 3.5 nm, it may further improve color purity and the like of the semiconductor nanocrystal. Furthermore, because a semiconductor nanocrystal including a core comprising a Group II-VI semiconductor has a larger band gap than a semiconductor nanocrystal including a core comprising a Group III-V semiconductor, the nanocrystal comprising a core comprising a Group II-VI semiconductor may have improved stability. In addition, because the nanocrystal does not include Cd, it may be more environmentally friendly.

Furthermore, the core itself may have luminous efficiency of more than about 20%. The core may have only band edge emission and not have trap emission. Herein, band edge emission refers to light that is emitted and has an energy corresponding to the band gap of a material of the core. Trap emission refers to an energy peak red-shifted by a trap between band gaps. Trap emission may be undesirable and may deteriorate luminous efficiency of the nanocrystal. Furthermore, although a luminous efficiency of a core depends on the particular application, the core may provide about 30%, more specifically about 40% or more improvement in luminous efficiency when the core has effectively no defect on a surface thereof.

When a core has a diameter of about 2 nm or less, it may have a trap emission as well as a band edge emission, deteriorating luminous efficiency and stability of the nanocrystal. In addition, when a core has a diameter of about 2 nm or less, the nanocrystal may not have a sufficiently uniform size distribution and may have a large full width at half maximum, and thus may have low color purity.

The core is surrounded with a first layer having a thickness of about 0.3 to about 2 nm. The wavelength of emitted light of a semiconductor nanocrystal may be determined based on the thickness of the first layer. For example, the thicker a first layer is, the longer an emitted light wavelength a semiconductor nanocrystal may have. The first layer may be a single layer or two or more layers.

In addition, the semiconductor nanocrystal may further include a second layer disposed on (e.g., surrounding) the first layer, and the second layer may include a Group II-VI or III-V semiconductor. A material of the second layer material may have a larger band gap energy than a material of the first layer. Furthermore, a material of the core may have a larger band gap energy than a material of the first layer.

The first layer may include a Group III-V semiconductor. The Group III element may include Al, Ga, In, Ti, or a combination comprising at least one of the foregoing, and the Group V element may include P, As, Sb, Bi, or a combination comprising at least one of the foregoing. For example, the first layer may include AlN, AlP, AlAs, AlSb, GaN, Gap, GaAs, GaSb, InN, InP, InAs, InSb, or a combination comprising at least one of the foregoing.

The second layer may include a Group II-VI or III-V semiconductor. The Group II element may include Zn, Cd, Hg, or a combination comprising at least one of the foregoing, and the Group VI element may include O, S, Se, Te, or a combination comprising at least one of the foregoing. The Group III and V elements are the same as aforementioned.

For example, the second layer may include ZnTe, ZnSe, ZnS, ZnO, AlN, AlP, AlAs, AlSb, GaN, Gap, GaAs, GaSb, InN, InP, InAs, InSb, or a combination comprising at least one of the foregoing.

FIG. 1 is a schematic cross-sectional view of an embodiment of a semiconductor nanocrystal. The semiconductor nanocrystal may have a core 100, a first layer 200, and a second layer 300. In an embodiment, the semiconductor nanocrystal may include a core comprising ZnSe, a first layer comprising InP, and a second layer comprising ZnS. However, the core, the first layer, and the second layer of the semiconductor nanocrystal are not limited thereto.

Hereinafter, a method of manufacturing a semiconductor nanocrystal is illustrated. Further description of the semiconductor nanocrystal which would be repetitive is omitted for clarity and conciseness.

In order to prepare the semiconductor nanocrystal, a first solution is prepared by contacting (e.g., mixing) a Group II precursor, a Group VI precursor, a surfactant, and a solvent, and thermally decomposing the first solution to prepare a core including a Group II-VI semiconductor.

Next, without a specific separation process, a second solution is prepared by contacting (e.g., mixing) the first solution with a Group III and a Group V precursor, and heat-treating the second solution to form a first layer on the core.

Then, the heat-treated second solution is contacted (e.g., mixed) with a Group II and a Group VI precursor, or a Group III and a V precursor, to form a second layer disposed on (e.g., surrounding) the first layer, to provide a third solution including the semiconductor nanocrystal.

Hereinafter, a composition for the semiconductor nanocrystal is illustrated in more detail. Further description of the aforementioned semiconductor nanocrystal which would be repetitive is omitted for clarity and conciseness.

A composition for the semiconductor nanocrystal may include a Group II precursor, a Group VI precursor, and a surfactant. The semiconductor nanocrystal may have a core with a diameter of about 2 to about 10 nm, specifically about 2 to about 5 nm, more specifically about 2 to about 3.5 nm. The core may have an emitted light wavelength of about 405 to about 530 nm, specifically about 415 to about 520 nm, specifically about 425 to about 510 nm.

In particular, when a semiconductor nanocrystal is prepared using a Zn precursor as the Group II precursor and a Se precursor, a Te precursor, a S precursor, an O precursor, or a combination comprising at least one of the foregoing as the Group VI precursor, and includes a core with a diameter of about 2 to about 10 nm, and an emitted light wavelength of about 405 to 530 nm, specifically about 415 to about 520 nm, more specifically about 425 to about 510 nm, the semiconductor nanocrystal may have improved color purity and the like. When a core has a diameter of about 5 nm or less, it may further improve color purity and the like of a semiconductor nanocrystal. When a core has a diameter of about 3.5 nm or less, it may further improve color purity and the like of a semiconductor nanocrystal.

In addition, a semiconductor nanocrystal having a core including a Group II-VI semiconductor has a larger band gap than a semiconductor nanocrystal having a core including a Group III-V semiconductor, and thus has higher stability. Further, a semiconductor nanocrystal having a core including a Group II-VI semiconductor is more environmentally friendly than a semiconductor nanocrystal having a core including Cd.

Furthermore, the core itself has luminous efficiency of about 20% or more specifically about 30% or more, more specifically about 40% or more, and the core may have only a band edge emission and not have a trap emission. When a core has a diameter of about 2 nm or less, it may have a trap emission as well as a band edge emission, deteriorating luminous efficiency and thus stability of the nanocrystal. In addition, when a core has a diameter of about 2 nm or less, a nanocrystal may have deteriorated color purity due to insufficient size distribution and may have a large full width at half maximum.

The composition for a semiconductor nanocrystal may further include Group III precursor and a Group V precursor. The Group III precursor and the Group V precursor may be used to form a first layer disposed on (e.g., surrounding) the core of a semiconductor nanocrystal. In addition, Group III precursor and the Group V precursor may also be used to form a second layer disposed on (e.g., surrounding) the first layer.

The first layer disposed on (e.g., surrounding) the core may have a thickness of about 0.3 to about 2 nm. While not wanting to be bound by theory, the thickness of the first layer may effectively determine the emitted light wavelength of a semiconductor nanocrystal. For example, a semiconductor nanocrystal having a thicker first layer may have a longer emitted light wavelength. Thus the emitted light wavelength may be proportional to the thickness of the first layer. The first layer may be a single layer or a composite of two or more layers. A material of the core may have larger band gap energy than a material in the first layer.

The composition for preparing a semiconductor nanocrystal may further include a Group II precursor and a Group VI precursor. The Group II precursor and the Group VI precursor may be used for forming a second layer disposed on (e.g., surrounding) the first layer. A material of the second layer has a larger energy band gap than a material of the first layer.

In an embodiment the surfactant may include a saturated or unsaturated $C_6$ to $C_{24}$ carboxylic acid, a saturated or unsaturated $C_6$ to $C_{24}$ phosphinic acid, a saturated or unsaturated $C_6$ to $C_{24}$ sulfinic acid, or a saturated or unsaturated $C_6$ to $C_{24}$ primary amine, or a combination comprising at least one of the foregoing. Examples of the surfactant may include a $C_6$ to $C_{24}$ alkane or alkene having a —COOH group at the end, a $C_6$ to $C_{24}$ alkane or alkene having a —POOH group at the end, a $C_6$ to $C_{24}$ alkane or alkene having a —SOOH group at the end, a $C_6$ to $C_{24}$ alkane or alkene having a —NH$_2$ group at the end, or the like. In particular, the surfactant may include oleic acid, stearic acid, palmitic acid, hexyl phosphonic acid, n-octyl phosphonic acid, tetradecyl phosphonic acid, octadecyl phosphonic acid, n-octylamine, hexadecyl amine, or the like, or a combination comprising at least one of the foregoing.

The composition for preparing a semiconductor nanocrystal may further include an organic solvent. The organic solvent may include a strongly-coordinating solvent, a weakly-coordinating solvent, or a non-coordinating solvent. For example, the organic solvent may include one or more of an aromatic solvent, such as chlorobenzene, or the like; an alkane solvent such as hexane, octane, or the like; an apolar solvent such as chloromethane (e.g., methyl chloride), or the like; or a polar solvent such as dimethyl formamide, tetrahydrofuran, or the like. In particular, the organic solvent may include a $C_6$ to $C_{24}$ primary alkyl amine (which may be strongly coordinating), a $C_6$ to $C_{24}$ secondary alkyl amine (which may be strongly coordinating), a $C_6$ to $C_{24}$ tertiary alkyl amine (which may be weakly coordinating), a primary $C_6$ to $C_{24}$ alcohol (which may be weakly coordinating), a secondary $C_6$ to $C_{24}$ alcohol (which may be weakly coordinating), a tertiary $C_6$ to $C_{24}$ alcohol (which may be weakly coordinating), a $C_6$ to $C_{24}$ ketone or ester (which may be weakly coordinating), a $C_6$ to $C_{24}$ nitrogen or sulfur-containing heterocyclic compound (which may be weakly coordinating), a $C_6$ to $C_{24}$ alkane (which may be non-coordinating), a $C_6$ to $C_{24}$ alkene (which may be non-coordinating), a $C_6$ to $C_{24}$ alkyne (which may be non-coordinating), a $C_6$ to $C_{24}$ trialkyl phosphine such as trioctyl phosphine (which may be weakly coordinating), a $C_6$ to $C_{24}$ trialkyl phosphine oxide such as trioctyl phosphine oxide (which may be strongly coordinating), or the like, or a combination comprising at least one of the foregoing.

The semiconductor nanocrystal may be combined with (e.g., bonded to) an organic ligand. The organic ligand can be physically or chemically combined with (e.g., bonded to) a semiconductor nanocrystal, and may include a lone electron pair or may be a material with a functional group that can form a complex with a metallic material. For example, the functional group may include a thiol group, an amine group, a carboxyl group, a phosphine group, a phosphine oxide group, or a combination comprising at least one of the foregoing. The organic ligand may be a substituted or unsubstituted hydrocarbon compound having a weight average molecular weight of about 10 to about 1,000,000 Daltons, specifically about 100 to about 100,000 Daltons, more specifically about 1,000 to about 10,000 Daltons. For example, the hydrocarbon compound may include an alkane, an alkene, an alkyne, an aromatic hydrocarbon, or a combination comprising at least one of the foregoing. In particular, the organic ligand may have a polydispersity index ("PDI") (number average molecular weight/weight average molecular weight) of less than about 2, specifically about 0.1 to about 2, more specifically about 0.5 to about 1.

The organic ligand may be represented by t Chemical Formula 1.

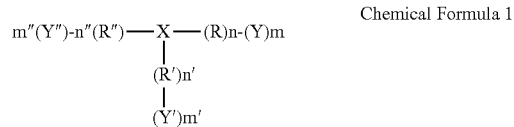

In Chemical Formula 1, R, R', and R" may be a C1 to C30 alkylene group; a C6 to C30 arylene group; a C6 to C30 heteroarylene group; a C3 to C30 cycloalkylene group; a C3 to C30 heterocycloalkylene group; a C2 to C30 alkenylene group; a C2 to C30 alkynylene group; a C3 to C30 alicyclic group having a double or triple bond in a ring; a C3 to C30 heterocycloalkylene group having a double or triple bond in a ring; a C3 to C30 alicyclic group substituted with a C2 to C30 alkenyl or alkynyl group; a C3 to C30 heterocycloalkylene group substituted with a C2 to C30 alkenyl or alkynyl group, or a combination comprising at least one of the foregoing. In an embodiment, n, n', and n" are 0 or an integer of more than 1. X is =S, —SH, P, —P=O, $PO_3$, =NH, —$NH_2$, —CN, —NC(O)—, —O—, a halogen, an acyl halide, —C(O)O—, —COOH, —H, —OH, or a combination comprising at least one of the foregoing; and Y, Y', and Y" are —SH, =NH, —$NH_2$, =C(O)O—, —H, —OH, —$PO_3H$, or a combination comprising at least one of the foregoing. In an embodiment, m, m', and m" are an integer of 0 or more.

The X of the organic ligand can be physically or chemically combined with (e.g., bonded to) a semiconductor nanocrystal.

Non-limiting examples of the organic ligand may include, but are not limited to, a thiol such as methane thiol, ethane thiol, propane thiol, butane thiol, pentane thiol, hexane thiol, octane thiol, dodecane thiol, hexadecane thiol, octadecane thiol, benzyl thiol, or the like; a mercapto spacer alcohol such as mercapto methanol, mercapto ethanol, mercapto propanol, mercapto butanol, mercapto pentenol, mercapto hexanol, or the like; a mercapto spacer carbonic acid such as mercapto acetic acid, mercapto propionic acid, mercapto butanoic acid, mercapto hexanoic acid, mercapto heptane, or the like; a mercapto spacer sulfonic acid such as mercapto methane sulfonic acid, mercapto ethane sulfonic acid, mercapto propane sulfonic acid, mercapto benzene sulfonic acid, or the like; a mercapto spacer amine such as mercapto methane amine, mercapto ethane amine, mercapto propane amine, mercapto butane amine, mercapto pentane amine, mercapto hexane amine, mercapto pyridine, or the like; a mercapto spacer thiol such as mercapto methyl thiol, mercapto ethyl thiol, mercapto propyl thiol, mercapto butyl thiol, mercapto pentyl thiol, or the like; an amine such as methane amine, ethane amine, propane amine, butane amine, pentane amine, hexane amine, octane amine, dodecane amine, hexadecyl amine, octadecyl amine, dimethyl amine, diethyl amine, dipropyl amine, or the like; an amino spacer alcohol such as amino methanol, amino ethanol, amino propanol, amino butanol, amino pentenol, amino hexanol, or the like; an amino spacer carbonic acid such as amino acetic acid, amino propionic acid, amino butanoic acid, amino hexanoic acid, amino heptane, or the like; an amino spacer sulfonic acid such as amino methane sulfonic acid, amino ethane sulfonic acid, amino propane sulfonic acid, amino benzene sulfonic acid, or the like; an amino spacer amine or diamine such as amino methane amine, amino ethane amine, amino propane amine, amino butyl amine, amino pentyl amine, amino hexyl amine, amino benzene amine, amino pyridine, or the like; a carboxylic acid such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, or the like; a carboxylic acid spacer alcohol such as carboxylic acid methanol, carboxylic acid ethanol, carboxylic acid propanol, carboxylic acid butanol, carboxylic acid pentenol, carboxylic acid hexanol, or the like; a carboxylic acid spacer sulfonic acid such as carboxylic acid methane sulfonic acid, carboxylic acid ethane sulfonic acid, carboxylic acid propane sulfonic acid, carboxylic acid benzene sulfonic acid, or the like; a carboxylic acid spacer carboxylic acid such as carboxylic acid methane carboxylic acid, carboxylic acid ethane carboxylic acid, carboxylic acid propane carboxylic acid, carboxylic acid propane carboxylic acid, carboxylic acid benzene carboxylic acid, or the like; a phosphine such as methyl phosphine, ethyl phosphine, propyl phosphine, butyl phosphine, pentyl phosphine, or the like; a phosphine alcohol such as phosphine methanol, phosphine ethanol, phosphine propanol, phosphine butanol, phosphine pentenol, phosphine hexanol, or the like; a phosphine spacer sulfonic acid such as phosphine methane sulfonic acid, phosphine ethane sulfonic acid, phosphine propane sulfonic acid, phosphine benzene sulfonic acid, or the like; a phosphine spacer carboxylic acid such as phosphine methane carboxylic acid, phosphine ethane carboxylic acid, phosphine propane carboxylic acid, phosphine benzene carboxylic acid, or the like; a phosphine spacer amine such as phosphine methane amine, phosphine ethane amine, phosphine propane amine, phosphine benzene amine, or the like; a phosphine oxide such as methyl phosphine oxide, ethyl phosphine oxide, propyl phosphine oxide, butyl phosphine oxide, or the like; a phosphine oxide alcohol such as phosphine oxide methanol, phosphine oxide ethanol, phosphine oxide propanol, phosphine oxide butanol, phosphine oxide pentenol, phosphine oxide hexanol, or the like; a phosphine oxide spacer sulfonic acid such as phosphine oxide methane sulfonic acid, phosphine oxide ethane sulfonic acid, phosphine oxide propane sulfonic acid, phosphine oxide benzene sulfonic acid, or the like; a phosphine oxide spacer carboxylic acid such as phosphine oxide methane carboxylic acid, phosphine oxide ethane carboxylic acid, phosphine oxide propane carboxylic acid, phosphine oxide benzene carboxylic acid, or the like; or a phosphine oxide spacer amine such as phosphine oxide methane amine, phosphine oxide ethane amine, phosphine oxide propane amine, phosphine oxide benzene amine, or the like, or a combination comprising at least one of the foregoing. Non-limiting examples of the spacer include a C1 to C16 alkylene or a C6 to C24 arylene. In an embodiment, the spacer is a C2 to C12 alkylene or a C8 to C16 arylene.

Hereinafter, a semiconductor nanocrystal composite is illustrated.

The semiconductor nanocrystal composite may include a semiconductor nanocrystal in contact with a matrix. In an embodiment, the matrix may envelop the semiconductor nanocrystal. The matrix may be an organic material, an inorganic material, or a combination comprising at least one of the foregoing. Non-limiting examples of the matrix may include: a polymer such as poly(vinyl alcohol), poly(vinyl carbazol), poly(vinyl fluoride), polymethyl vinyl ether, polyethylene, polypropylene, polystyrene, poly(vinyl pyridine), poly(ethylene oxide), polyalkylacrylate, poly(silane), polycarbonate, polysiloxane, acrylate, silicon, epoxy, or the like; an inorganic material such as titania, silica, alumina, zirconia, indium tin oxide, or the like; or a combination comprising at least one of the foregoing.

Hereinafter, a current-driving light emission device including the semiconductor nanocrystal as a light-emitting material is illustrated with reference to FIG. 2.

Figure 2:
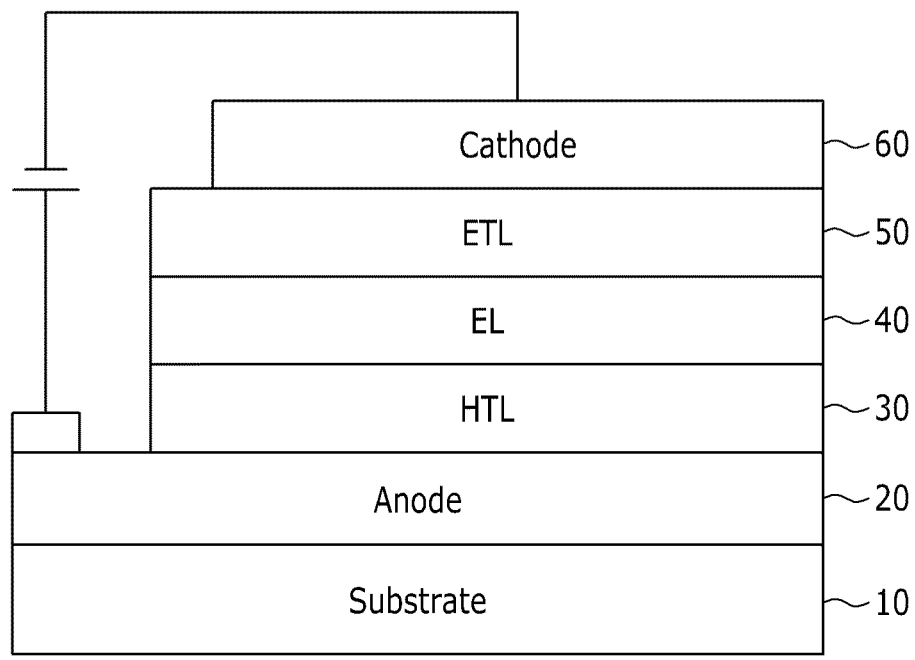
FIG. 2 is the cross-sectional view of an embodiment of a current-driven light emission device including a semiconductor nanocrystal.

FIG. 2 provides the cross-sectional view of an embodiment of a light emission device including a semiconductor nanocrystal.

In general, a light emitting device includes an organic light emitting diode ("OLED"), or the like. An OLED includes an organic emission layer between two electrodes and emits light when an electron and a hole, which are injected from the two electrodes into the organic emission layer, combine to produce an exciton, which falls from an excited state to a ground state, emitting a photon.

As shown in FIG. 2, an OLED display may include an anode 20 on an organic substrate 10. The positive material may have a high work function so that a hole can be injected, and may include a transparent oxide such as indium tin oxide ("ITO"), indium oxide, or the like.

A hole transport layer ("HTL") 30, an emission layer ("EL") 40, and an electron transport layer ("ETL") 50 are sequentially disposed on the positive electrode 20. The hole transport layer 30 may include a p-type semiconductor, and the electron transport layer 50 may include an n-type semiconductor, a metal oxide, or a combination comprising at least one of the foregoing. In an embodiment, the emission layer 40 may include a nanocrystal.

Next, a cathode 60 is disposed on the electron transport layer 50. The cathode 60 may comprise a material with a low work function so that an electron can be easily injected into the electron transport layer 50. Examples of the material may include a metal, such as magnesium, calcium, sodium, potassium, titanium, indium, yttrium, lithium, gadolinium, aluminum, silver, tin, lead, cesium, barium, or the like, or an alloy thereof, a multi-layered material such as LiF/Al, LiO$_2$/Al, LiF/Ca, LiF/Al, or BaF2/Ca, or the like, or a combination comprising at least one of the foregoing, but is not limited thereto. Additional details of a method of respectively preparing and assembling the positive electrode 20, the hole transport layer 30, the emission layer 40, the electron transport layer 50, and the cathode 60 may be determined by one of ordinary skill in the art without undue experimentation, and thus is not illustrated in further detail.

Hereinafter, a light-transforming light emission device including the semiconductor nanocrystal as a light-emitting material is illustrated with reference to FIG. 3.

Figure 3:
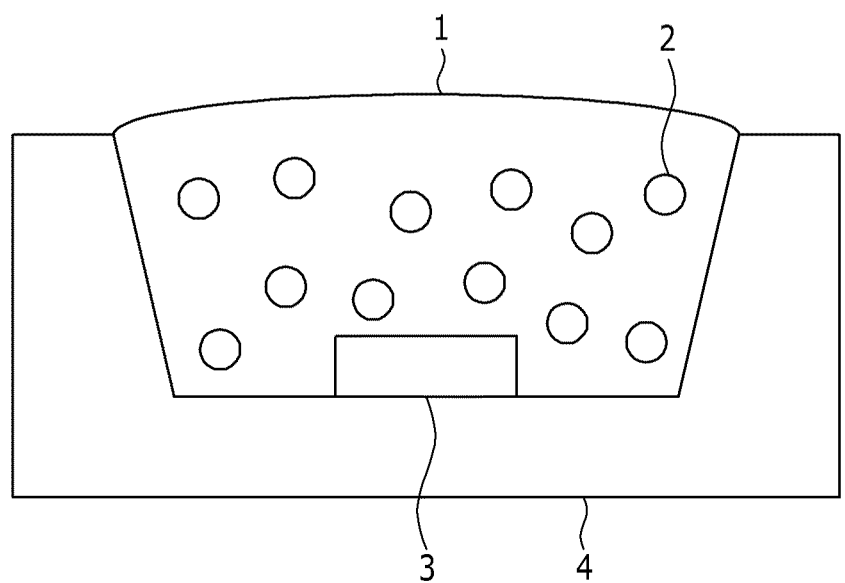
FIG. 3 is the cross-sectional view of an embodiment of a light-transforming emission device.

FIG. 3 is a cross-sectional view of a light-transforming emission device according to an embodiment.

First, a substrate 4 comprising Ag, or the like is prepared. The substrate 4 includes a recessed portion. Next, a light emitting diode chip 3, which emits light having a wavelength corresponding to a blue or ultraviolet ("UV") light is disposed on the substrate 4 and electrically connected with a wire.

Then, a matrix 1 including a semiconductor nanocrystal 2 is disposed (e.g., formed) on the light emitting diode chip 3. Herein, the semiconductor nanocrystal 2 may include a nanocrystal which emits a red, green, or blue light. Also, a nanocrystal may be referred to by the color of light it emits, thus a "red nanocrystal" may be a nanocrystal which emits red light, for example. In addition, the matrix 1 may be a transparent organic or inorganic material through which light can be transmitted. The semiconductor nanocrystal 2 is mixed inside the matrix 1. Thus in an embodiment, the matrix 1 and the semiconductor 2 form a composite. The composite may be disposed (e.g., coated) on the recessed portion of the substrate 4, covering the light emitting diode chip 3.

The semiconductor nanocrystal 2 may absorb luminescent energy of the light emitting diode chip 3 and may emit energy as light having a different wavelength. The semiconductor nanocrystal 2 may be selected to have various emitted light wavelengths, providing excellent color purity. For example, red and green nanocrystals may be combined with a blue light emitting diode chip, to provide a white light emitting diode. In addition, red, green, and blue nanocrystals may be combined with an ultraviolet ("UV") light emitting diode chip, to provide a white light emitting diode. Furthermore, a nanocrystal emitting light of various wavelengths may be combined with a light emitting diode chip, to provide a light emitting diode emitting light of various wavelengths.

Hereafter, this disclosure will be described in further detail by way of examples. The following examples are illustrative and shall not be limiting or restrictive.

Example 1

Example 1-1

Two millimoles (mmol) of 1-hexadecylamine are mixed with 8 mmol of trioctylphosphine oxide to provide a mixture. The mixture is heated at 150° C. under vacuum and then maintained at the same temperature for 2.5 hours. Separately, 0.4 mmol of diethyl zinc is mixed with 0.2 milliliters (mL) (0.2 mmol) of 1M tri-n-octylphosphine-selenide and 3 mL of trioctylphosphine, to provide an injection solution. The injection solution is maintained under vacuum, then is heated to 320° C. under a nitrogen atmosphere, and then is rapidly injected into the aforementioned mixture. The resulting mixture is maintained at 270° C. for one hour, cooled to room temperature, and is then mixed with 0.3 mmol of zinc acetate. Then, the resulting mixture is heated to 230° C. and maintained for 3 hours, to provide a ZnSe nanocrystal solution.

Example 1-2

The ZnSe nanocrystal solution prepared in Example 1-1 is mixed with 8 grams (g) of octadecene and 92.3 milligrams (mg) of palmitic acid. The mixture is heated to 105° C. under vacuum and maintained at the same temperature for 2 hours. Separately, 0.2 mmol of tributylphosphine-indium is mixed with 0.2 mmol of trimethylsilyl-3-phosphine and 2 mL of octadecene, to provide an InP precursor solution. The InP precursor solution is maintained under vacuum, is heated to 200° C., and is then slowly added to the aforementioned mixture to provide a ZnSe/InP nanocrystal solution.

Example 2

The ZnSe/InP nanocrystal solution prepared according to Example 1 is mixed with 0.3 mmol of zinc acetate. The mixture is heated to 230° C. and maintained for 4 hours, to provide a ZnSe/InP/ZnS nanocrystal solution. In addition, 0.1 mmol of 1-dodecanethiol is added to the ZnSe/InP/ZnS nanocrystal solution. The resulting mixture is maintained at 230° C. for one hour.

Example 3

A ZnSe/InP/ZnS nanocrystal solution is prepared according to the same method as Example 1, except for adding a mixture of 0.4 mmol of tributylphosphine-indium, 14 mL of trimethylsilyl-3-phosphine, and 0.4 mmol of octadecene thereto in Example 1-2.

Observation of Crystal Particles

Figure 4:
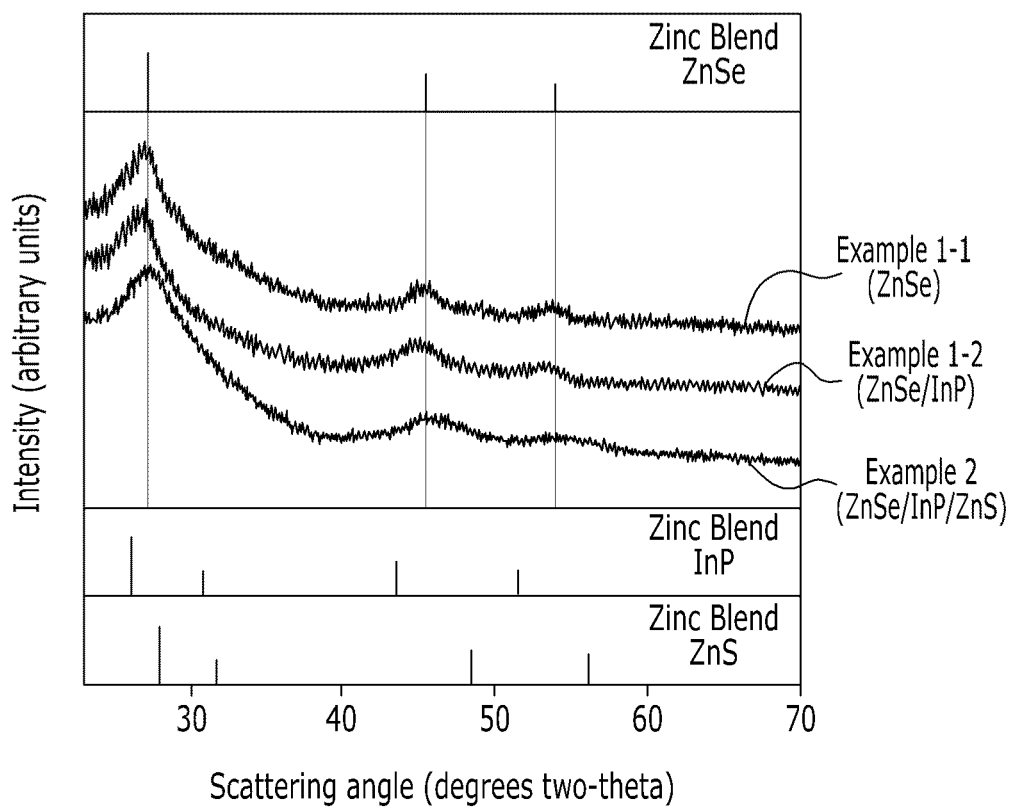
FIG. 4 is a graph of intensity (arbitrary units) versus scattering angle (degrees two-theta, $2\theta$) and is an X-ray diffraction ("XRD") pattern of an embodiment of a semiconductor nanocrystal according to one embodiment.
Figure 5A:
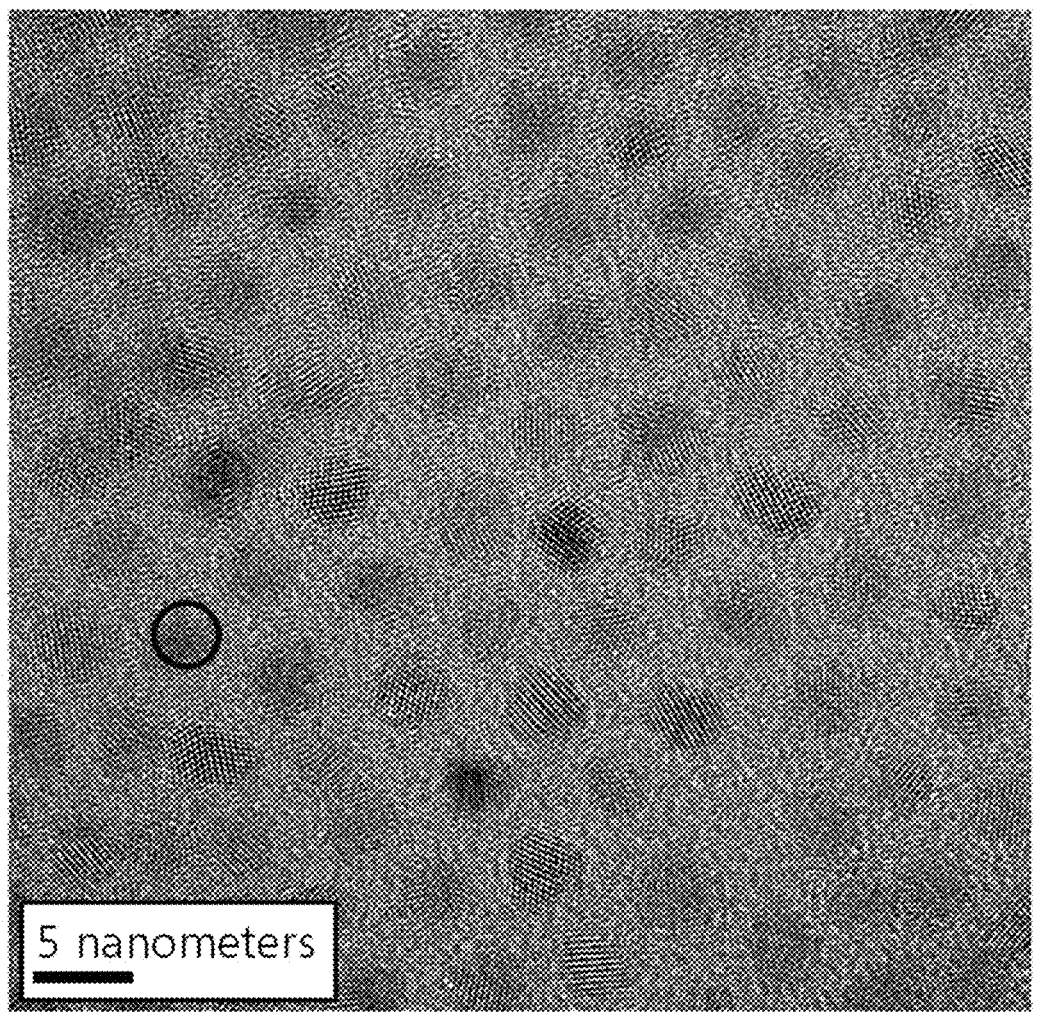
FIGS. 5A to 5C are transmission electron microscope ("TEM") photographs of an embodiment of a semiconductor nanocrystal.
Figure 5B:
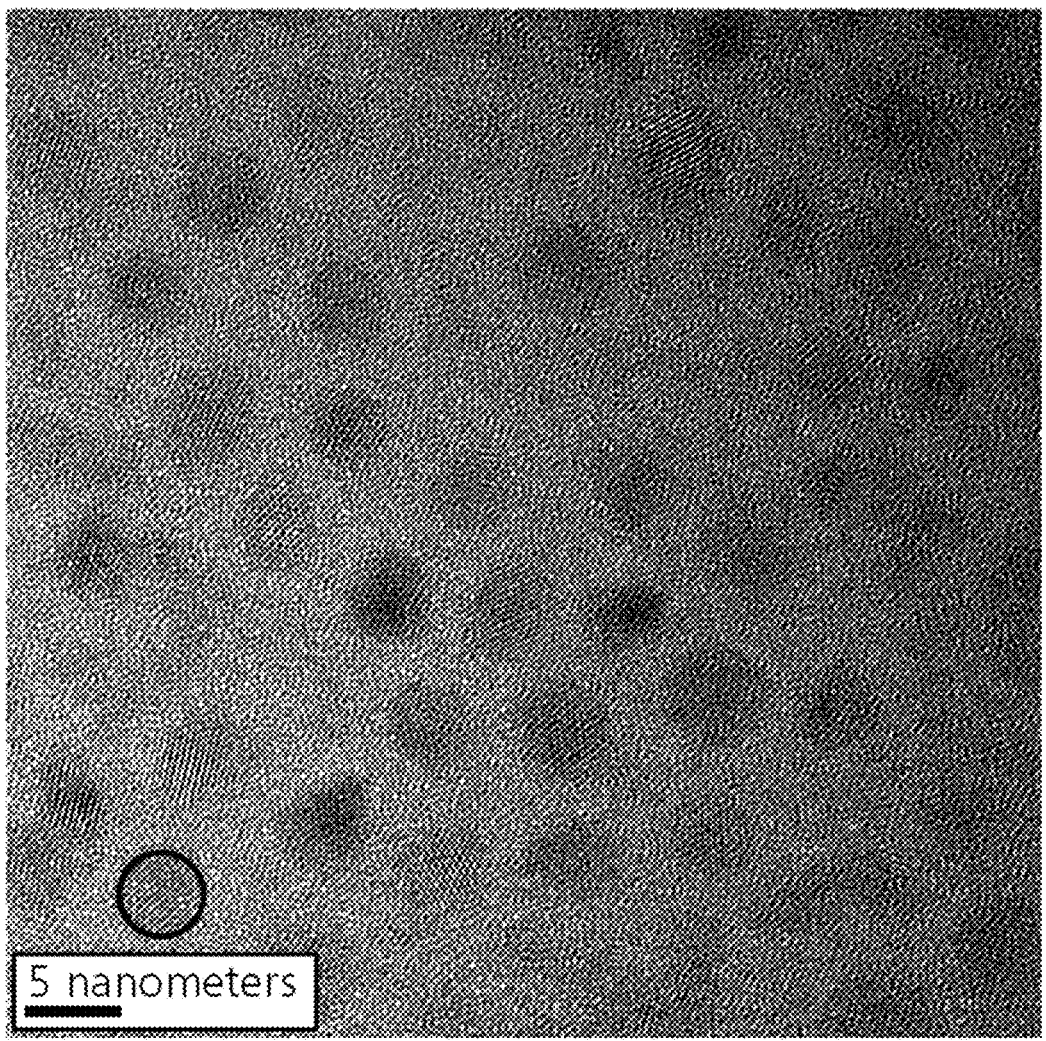
Figure 5C:
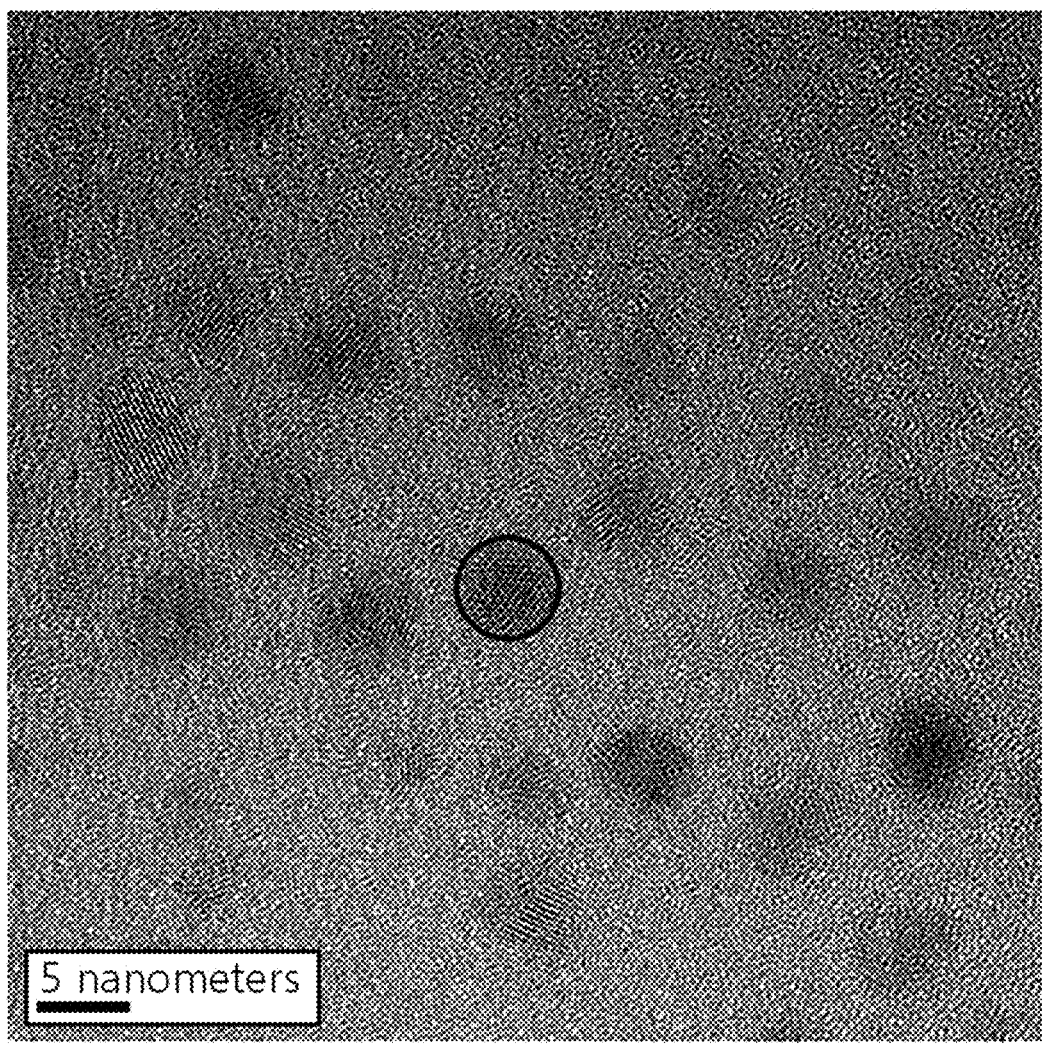

The ZnSe prepared in Example 1-1, the ZnSe/InP prepared in Example 1-2, and the ZnSe/InP/ZnS nanocrystal solution prepared according to Example 2 are measured using X-ray diffraction ("XRD"). FIG. 4 provides the XRD patterns of the ZnSe prepared in the Example 1-1, the ZnSe/InP prepared in Example 1-2, and the ZnSe/InP/ZnS nanocrystal solution prepared in Example 2. FIGS. 5A to 5C provide TEM photographs of these materials.

The ZnSe core has an XRD pattern equal to the XRD pattern of a bulk ZnSe semiconductor. The XRD patterns of ZnSe/InP and ZnSe/InP/ZnS have shifted peaks relative to the ZnSe core, showing that a nanocrystal has a core/shell structure and a core/shell/shell structure.

FIG. 5A shows a TEM photograph of the ZnSe nanocrystal. The ZnSe nanocrystal has an average diameter of about 3 nanometers (nm). FIG. 5B shows a TEM photograph of the ZnSe/InP nanocrystal. The ZnSe/InP nanocrystal has an average diameter of about 4 to 4.5 nm. FIG. 5C shows a TEM photograph of the ZnSe/InP/ZnS nanocrystal. The ZnSe/InP/ZnS nanocrystal has an average diameter of about 6 to 7 nm. Referring to FIGS. 5A to 5C, the nanocrystal has a relatively large and uniform particle size.

The nanocrystal solutions prepared in Examples 1 and 2 are measured using inductively coupled plasma mass spectroscopy ("ICP-MS"). The results are provided in Table 1. Table 1 shows that InP and ZnS shells are formed.

TABLE 1

|  |  | S | Zn | Se | P | In |
|---|---|---|---|---|---|---|
| Example 1 | (mmol) | 0 | 6.591 | 3.622 | 7.522 | 6.294 |
| (ZnSe/InP) | (mol %) | 0 | 27.43 | 15.07 | 31.30 | 26.20 |
| Example 2 | (mmol) | 19.616 | 5.307 | 2.153 | 4.746 | 3.743 |
| (ZnSe/InP/ZnS) | (mol %) | 55.13 | 14.91 | 6.15 | 13.30 | 10.51 |

Stability Measurement

Figure 6:
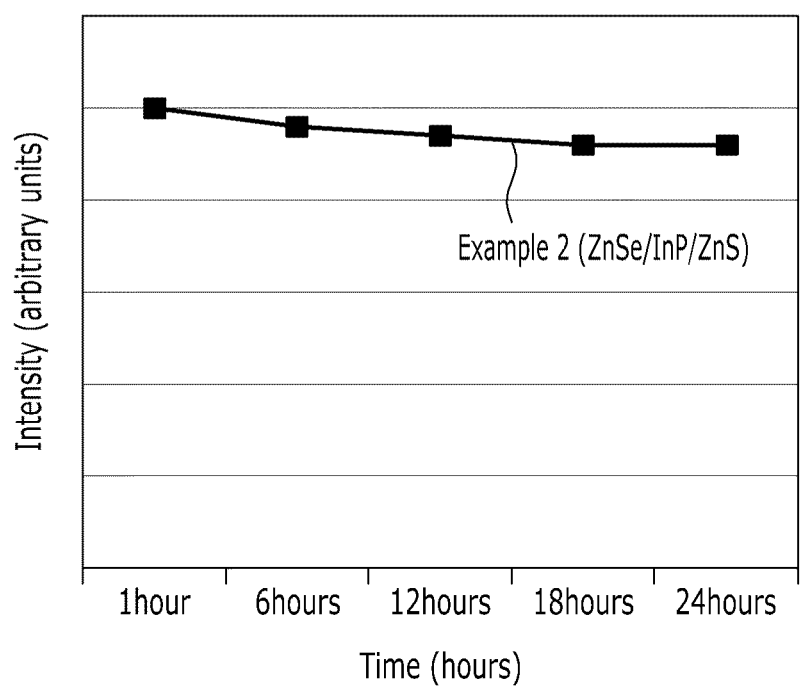
FIG. 6 is a graph of intensity (arbitrary units) versus time (hours) illustrating the thermal stability of an embodiment of a semiconductor nanocrystal at 120° C. in air.

The stability of the nanocrystal solution of Example 2 is measured. The results are provided in FIG. 6. The nanocrystal solution is maintained at 120° C. for 24 hours and measured regarding luminance intensity. FIG. 6 shows an improvement in thermal stability.

Measurement of Luminous Spectrum

The luminous spectrum of the nanocrystal solutions of Example 1-1 and Examples 2 and 3 are measured. Their luminous efficiency, wavelengths showing a maximum peak in the luminous spectra, and full width at half maximum of the luminous spectra are provided in Table 2. As shown in Table 2, the ZnSe core itself has a high luminous efficiency of 43%. In addition, the ZnSe/InP/ZnS nanocrystal emits green and red light, has a high luminous efficiency, and high color purity, as shown by the full width at half maximum of about 35 nm or less.

TABLE 2

|  | Luminous efficiency (%) | Maximum peak (nm) | Full width at half maximum (nm) |
|---|---|---|---|
| Example 1-1 (Initial ZnSe) | 43 | 404 | 29 |
| Example 2 (ZnSe/InP/ZnS) | 46 | 543 | 35 |
| Example 3 (ZnSe/InP/ZnS) | 58 | 613 | 34 |

Example 4

A ZnSe nanocrystal solution is prepared according to the same method as in Example 1-1, and an InP precursor solution is prepared by mixing 0.4 mmol of tributylphosphine-indium, 0.4 mmol of trimethylsilyl-3-phosphine, and 4 mL of octadecene according to the same method as in Example 1-2. Then, each predetermined amount (i.e., 0.5 mL, 1 mL, 1.7 mL, 2.4 mL, and 3.4 mL) of the InP precursor solution is injected in to the ZnSe nanocrystal solution. Then, the emitted light spectrum of each ZnSe nanocrystal solution is analyzed. The results are provided in FIG. 7A.

Example 5

A ZnSe nanocrystal solution is prepared according to the same method as in Example 1-1 except for lowering the temperature to about 250° C., and an InP precursor solution is prepared by mixing 0.4 mmol of tributylphosphine-indium, 0.4 mmol of trimethylsilyl-3-phosphine, and 4 mL of octadecene according to the same method as in Example 1-2. Each predetermined amount (i.e., 0.5 mL, 1 mL, 1.7 mL, 2.4 mL) of the InP precursor solution is injected in to the ZnSe nanocrystal solution. Then, the emitted light spectrum of the ZnSe nanocrystal solution is analyzed. The results are provided in FIG. 7B.

Comparative Example 1

A ZnSe nanocrystal solution is prepared according to the same method as in Example 1-1 except for increasing the temperature to about 300° C., and an InP precursor solution is prepared by mixing 0.4 mmol of tributylphosphine-indium, 0.4 mmol of trimethylsilyl-3-phosphine, and 4 mL of octadecene according to the same method as in Example 1-2. Each predetermined amount (i.e., 0.5 mL, 1 mL, 1.7 mL, 2.4 mL, and 3.4 mL) of the InP precursor solution is injected to the ZnSe nanocrystal solution. Then, the emitted light spectrum of the ZnSe nanocrystal solution is analyzed. The results are provided in FIG. 8.

Figure 7A:
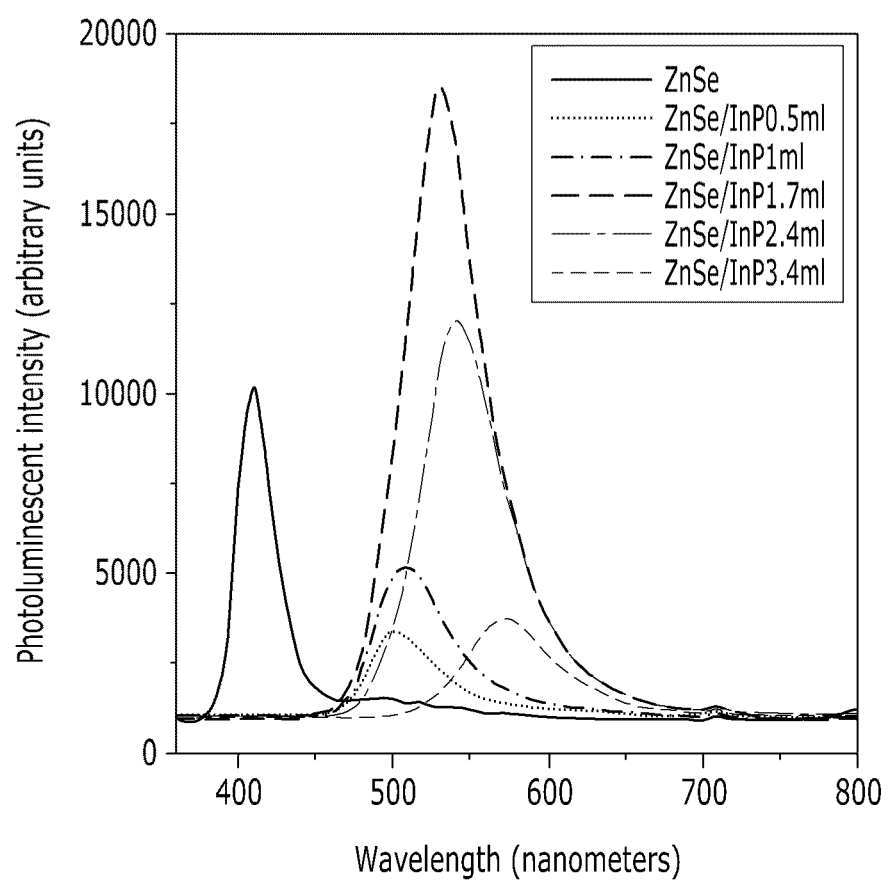
FIGS. 7A and 7B are each a graph of photoluminescent intensity (arbitrary units) versus wavelength (nanometers), each illustrating a luminescent spectrum of an embodiment of a semiconductor nanocrystal.
Figure 7B:
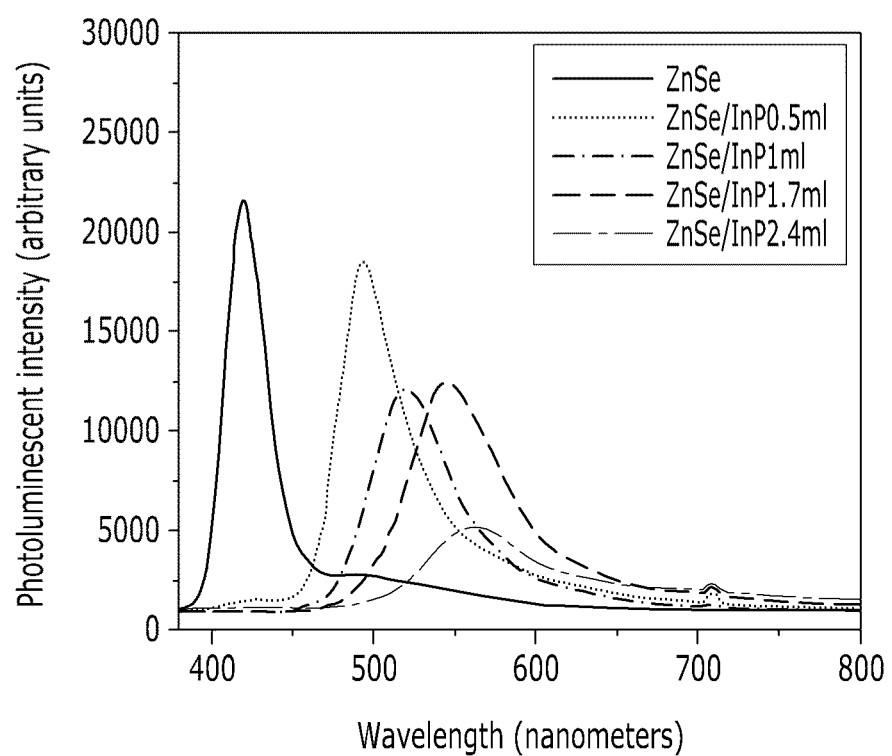

The ZnSe core according to Example 4 has an average diameter of about 2 nm or more and a shell thickness of about 1 nm or more. The ZnSe core according to Example 4 has an emitted light wavelength of about 407 nm, and the ZnSe core according to Example 5 has an emitted light wavelength of about 437 nm. As shown in FIGS. 7A and 7B, the nanocrystals of Examples 4 and 5 have only band edge emission, and do not have trap light emission. Accordingly, they maintain high luminous efficiency, which shows that an InP shell is formed.

Figure 8:
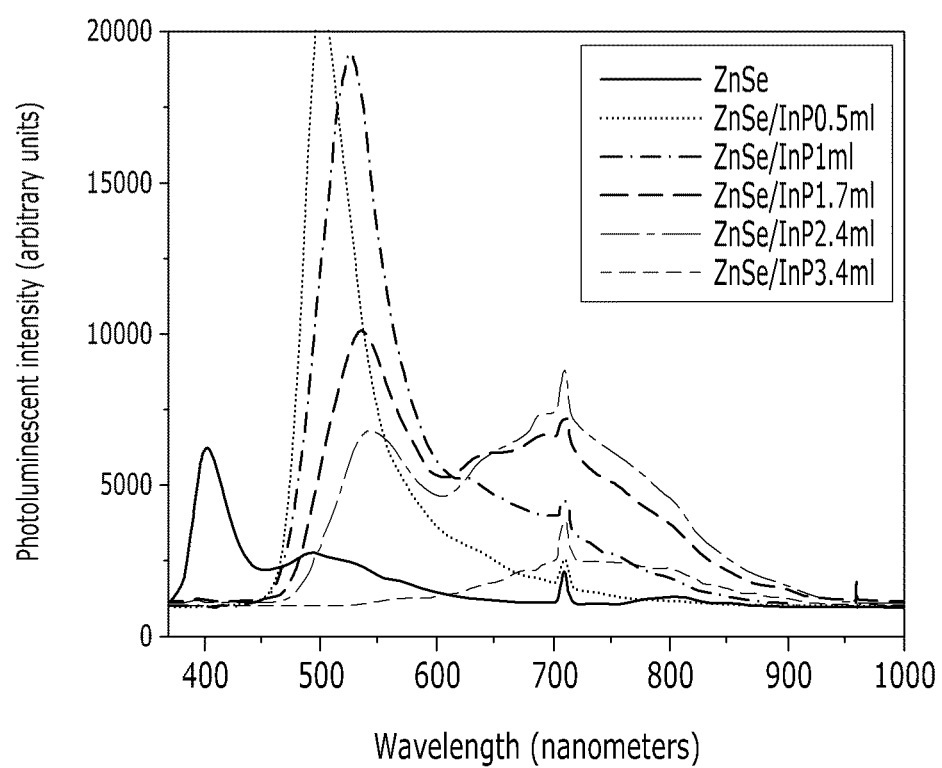
FIG. 8 is a graph of photoluminescent intensity (arbitrary units) versus wavelength (nanometers) illustrating the luminescent spectrum of the semiconductor nanocrystal of Comparative Example 1.

The ZnSe core of Comparative Example 1 has an average diameter of about 2 nm or less. Accordingly, the nanocrystal including a shell may have a smaller size and deteriorated stability. In addition, as shown in FIG. 8, the nanocrystal according to Comparative Example 1 has band edge emission and trap light emission.

Comparative Example 2

A 150 g quantity of hexadecylamine is put in a flask and dried at 120° C. for 1 hour, and 5 g of $[Zn_{10}S_4(SPh)_{16}]$ $[Et_3NH_4]$ is added thereto under a nitrogen atmosphere. Then, 3.53 mL of trioctylphosphine selenide is further added thereto. The resulting mixture is heated to about 280° C. and then cooled, thereby preparing a ZnSe core.

A 50 mL quantity of dibutyl ester and 5.65 g of stearic acid are put in a flask. The flask is heated for one hour at 90° C. and dried, and 0.5 g of the ZnSe core is added thereto. The resulting mixture is heated to 180° C., while 1.125 mL of trimethyl indium and 1.125 mL of trimethylsilyl-3-phosphine are added thereto. The resulting mixture is maintained at the same temperature for 10 minutes and heated to 200° C. Next, 2.25 mL of trimethyl indium and 2.25 mL of trimethylsilyl-3-phosphine are further added thereto at 200° C. The resulting product is heated to 220° C., and 3.375 mL of trimethyl indium and 3.375 mL of trimethylsilyl-3-phosphine are lastly added thereto. As a result, the reaction mixture is changed from orange/yellow to dark red and heated again for one hour at 220° C. and then cooled. Then, 100 mL of ethanol is added thereto at room temperature to provide a precipitate. The precipitate is centrifugally separated and then dispersed into toluene.

Figure 9A:
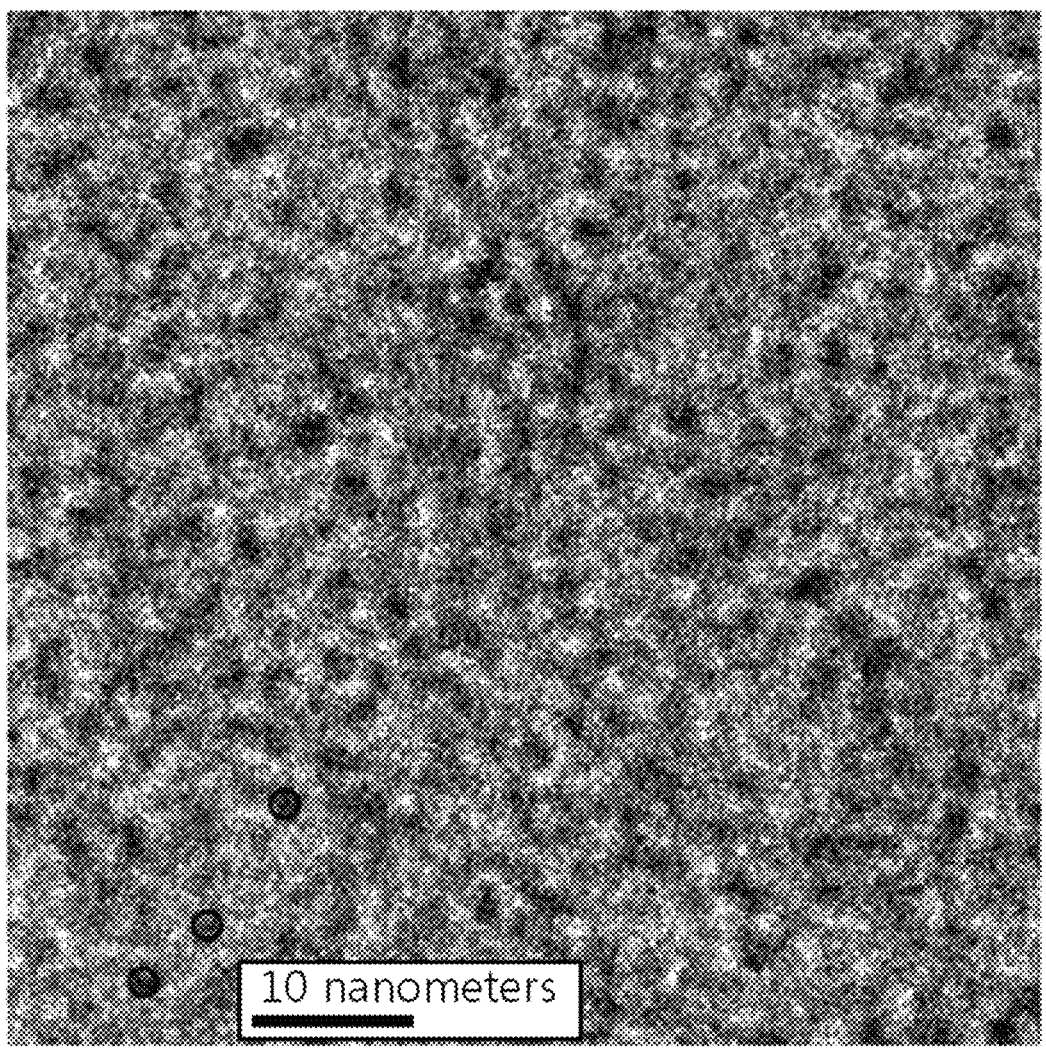
FIGS. 9A and 9B are TEM photographs of the semiconductor nanocrystal of Comparative Example 2.

The nanocrystal of Comparative Example 2 includes a ZnSe core with an average diameter of about 2 nm or less. The final ZnSe/InP product includes an InP shell having a thickness of about 1 nm or less. The ZnSe nanocrystal according to Comparative Example 2 is photographed with a TEM. The result is provided in FIG. 9A. The ZnSe/InP nanocrystal is photographed with a TEM. The result is provided in FIG. 9B. FIG. 9A has a scale bar of 10 nm, while FIG. 9B has a scale bar of 50 nm.

Figure 9B:
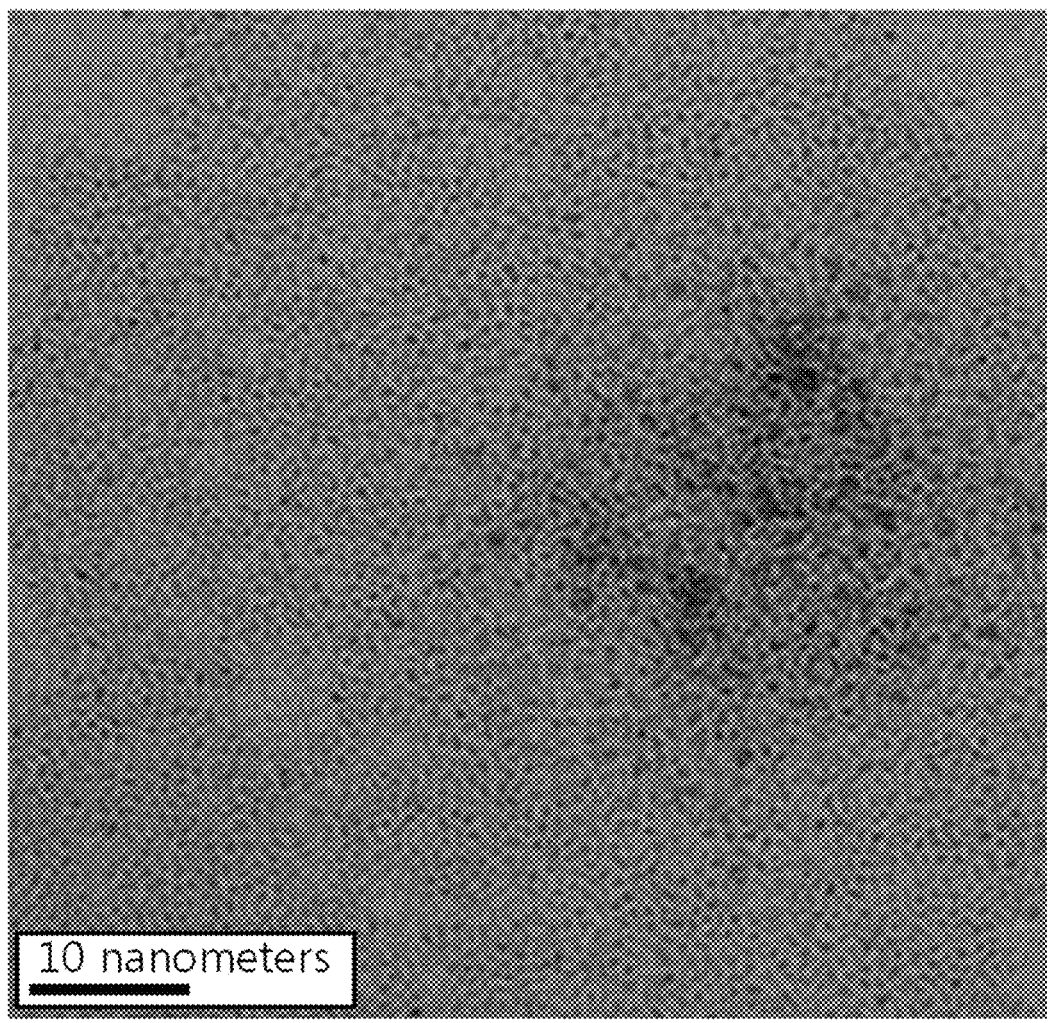
Figure 9C:
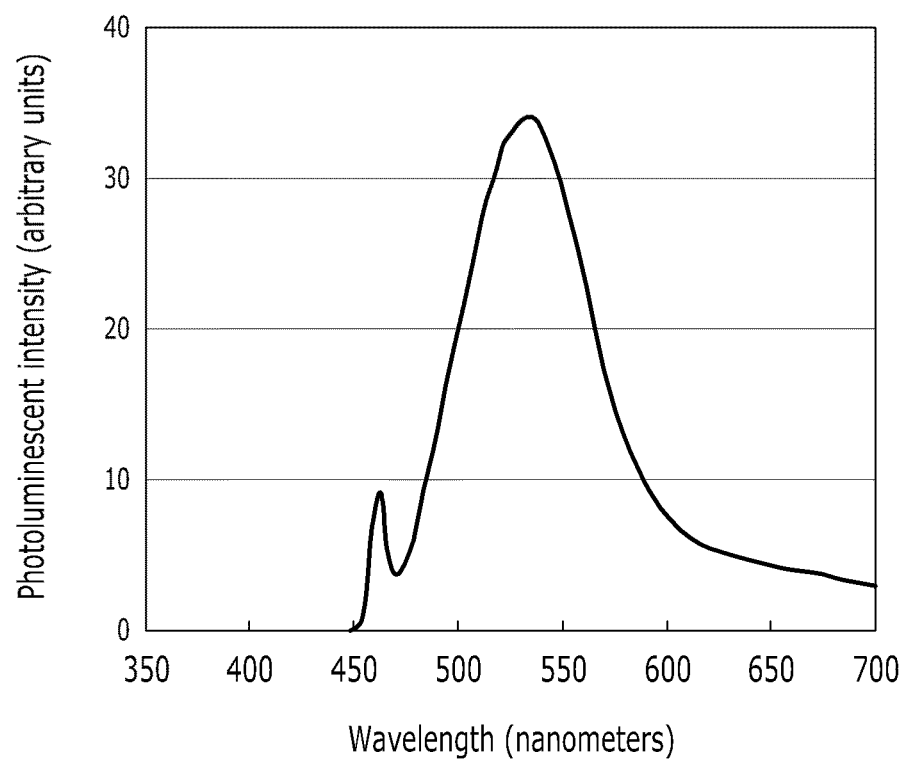
FIG. 9C is a graph of photoluminescent intensity (arbitrary units) versus wavelength (nanometers) illustrating the luminescent spectrum of the semiconductor nanocrystal of Comparative Example 2.

Comparing FIGS. 9A and 9B with FIGS. 5A to 5C, when a nanocrystal has a small core, the nanocrystal has a uniform size. In addition, as shown in FIG. 9C, when a nanocrystal has a small core, its emitted light wavelength is broad.

While this disclosure has been described in connection with what is presently considered to be practical exemplary embodiments, it is to be understood that the invention is not limited to the disclosed embodiments, but, on the contrary, is intended to include various modifications and equivalent arrangements included within the spirit and scope of the appended claims.

What is claimed is:

1. A semiconductor nanocrystal comprising:
a core comprising ZnSe, ZnTe, ZnS, ZnO, or a combination thereof, wherein the core has a diameter of about 2 nanometers to about 5 nanometers and an emitted light wavelength of about 405 nanometers to about 530 nanometers;
a first layer disposed on the core, the first layer comprising AlN, AlP, AlAs, AlSb, GaN, GaP, GaAs, GaSb, InN, InP, InAs, InSb, or a combination thereof and having a thickness of about 0.3 nanometers to about 2 nanometers; and
a second layer disposed on the first layer, the second layer comprising a Group II-VI or a Group III-V semiconductor material,
wherein a material of the second layer has a band gap energy which is greater than a band gap energy of a material of the first layer,
wherein a material of the core has a band gap energy which is greater than the band gap energy of the material of the first layer,
wherein the semiconductor nanocrystal does not comprise cadmium, and
wherein the semiconductor nanocrystal has a full width at half maximum of an emitted light wavelength of less than or equal to about 60 nanometers.

2. The semiconductor nanocrystal of claim 1, wherein the core has a full width at half maximum of about 10 nanometers to about 30 nanometers.

3. The semiconductor nanocrystal of claim 1, wherein the core has luminous efficiency of about 20 percent or more.

4. The semiconductor nanocrystal of claim 3, wherein the core has only band edge emission.

5. The semiconductor nanocrystal of claim 1, wherein the core has a diameter of about 2 nanometers to about 3.5 nanometers.

6. The semiconductor nanocrystal of claim 1, wherein the core emits light having a wavelength of about 410 nanometers to about 1200 nanometers.

7. The semiconductor nanocrystal of claim 1, wherein the core has no substantial trap emission.

8. The semiconductor nanocrystal of claim 1, wherein the second layer comprises ZnTe, ZnSe, ZnS, ZnO, AlN, AlP, AlAs, AlSb, GaN, Gap, GaAs, GaSb, InN, InP, InAs, InSb, or a combination thereof.

9. The semiconductor nanocrystal of claim 1, further comprising a second layer on the first layer, the second layer comprising a Group II-VI semiconductor or a Group III-V semiconductor.

10. The semiconductor nanocrystal of claim 9, wherein a material of the second layer has a larger band gap energy than a material of the first layer.

11. The semiconductor nanocrystal of claim 9, wherein the second layer comprises ZnTe, ZnSe, ZnS, ZnO, AlN, AlP, AlAs, AlSb, GaN, Gap, GaAs, GaSb, InN, InP, InAs, InSb, or a combination comprising at least one of the foregoing.

12. The semiconductor nanocrystal of claim 9, wherein the core has a full width at half maximum of about 10 nanometers to about 30 nanometers.

13. The semiconductor nanocrystal of claim 9, wherein the core has luminous efficiency of about 20 percent or more.

14. The semiconductor nanocrystal of claim 13, wherein an emission of the core is only band edge emission.

15. A semiconductor nanocrystal composite comprising:
the semiconductor nanocrystal according to claim 1; and
a matrix.

16. The semiconductor nanocrystal composite of claim 15, wherein the matrix comprises poly(vinyl alcohol), poly(vinyl carbazol), poly(vinyl fluoride), polymethyl vinyl ether, polyethylene, polypropylene, polystyrene, poly(vinyl pyridine), poly(ethylene oxide), polyalkylacrylate, poly(silane), polycarbonate, polysiloxane, acrylate, silicon, epoxy, titania, silica, alumina, zirconia, indium tin oxide, or a combination comprising at least one of the foregoing.

17. A luminescence device comprising the semiconductor nanocrystal composite according to claim 1.

18. The luminescence device of claim 17, wherein the luminescence device comprises two electrodes and the semiconductor nanocrystal between the two electrodes.

19. The luminescence device of claim 17, wherein the luminescence device comprises a light source and the semiconductor nanocrystal is disposed on the light source.

20. The semiconductor nanocrystal of claim 1, wherein neither the core nor the first layer has a trap in a band structure thereof.

21. The semiconductor nanocrystal of claim 1, wherein the first layer consists of a Group III-V semiconductor.

22. The semiconductor nanocrystal of claim 1, wherein the core consists of ZnSe and the first layer consists of InP.

* * * * *